United States Patent
Li et al.

(10) Patent No.: US 8,164,234 B2
(45) Date of Patent: Apr. 24, 2012

(54) SPUTTERED PIEZOELECTRIC MATERIAL

(75) Inventors: Youming Li, San Jose, CA (US); Jeffrey Birkmeyer, San Jose, CA (US)

(73) Assignee: FUJIFILM Corporation, Tokyo (JP)

( * ) Notice: Subject to any disclaimer, the term of this patent is extended or adjusted under 35 U.S.C. 154(b) by 336 days.

(21) Appl. No.: 12/393,644

(22) Filed: Feb. 26, 2009

(65) Prior Publication Data
US 2010/0213795 A1    Aug. 26, 2010

(51) Int. Cl.
H01L 41/087    (2006.01)
(52) U.S. Cl. .......... 310/358; 252/62.9 PZ; 501/134
(58) Field of Classification Search ........... 310/358, 310/363; 252/62.9 R, 62.9 PZ; 501/134; 257/347
See application file for complete search history.

(56) References Cited

U.S. PATENT DOCUMENTS

| | | | |
|---|---|---|---|
| 5,834,803 A * | 11/1998 | Nashimoto | 257/295 |
| 6,576,546 B2 | 6/2003 | Gilbert et al. | |
| 7,101,490 B2 * | 9/2006 | Helke | 252/62.9 PZ |
| 7,456,548 B2 * | 11/2008 | Kubota et al. | 310/324 |
| 2004/0004237 A1 | 1/2004 | Fox | |
| 2004/0090500 A1 | 5/2004 | Murai | |
| 2005/0099467 A1 | 5/2005 | Bibl et al. | |
| 2005/0162047 A1 | 7/2005 | Torii et al. | |
| 2005/0271823 A1 | 12/2005 | Kijima et al. | |
| 2007/0236104 A1 | 10/2007 | Fujii | |
| 2008/0062228 A1 | 3/2008 | Saito | |
| 2008/0074471 A1 | 3/2008 | Sakashita et al. | |
| 2008/0233277 A1 * | 9/2008 | Kubota et al. | 427/100 |
| 2009/0152607 A1 * | 6/2009 | Tanaka et al. | 257/295 |

OTHER PUBLICATIONS

Youming Li et al., "Physical Vapor Deposition With Impedance Matching Network", U.S. Appl. No. 12/389,253, filed Feb. 19, 2009, 26 pp.
Notification of Transmittal of the International Search Report and Written Opinion of the International Searching Authority for Application No. PCT/US2010/025012, dated Apr. 23, 2010, 9 pages.

* cited by examiner

*Primary Examiner* — Jaydi San Martin
(74) *Attorney, Agent, or Firm* — Fish & Richardson P.C.

(57) ABSTRACT

Piezoelectric actuators having a composition of $Pb_{1.00+x}(Zr_{0.52}Ti_{0.48})_{1.00-y}O_3Nb_y$, where $x>-0.02$ and $y>0$ are described. The piezoelectric material can have a Perovskite, which can enable good bending action when a bias is applied across the actuator.

6 Claims, 2 Drawing Sheets

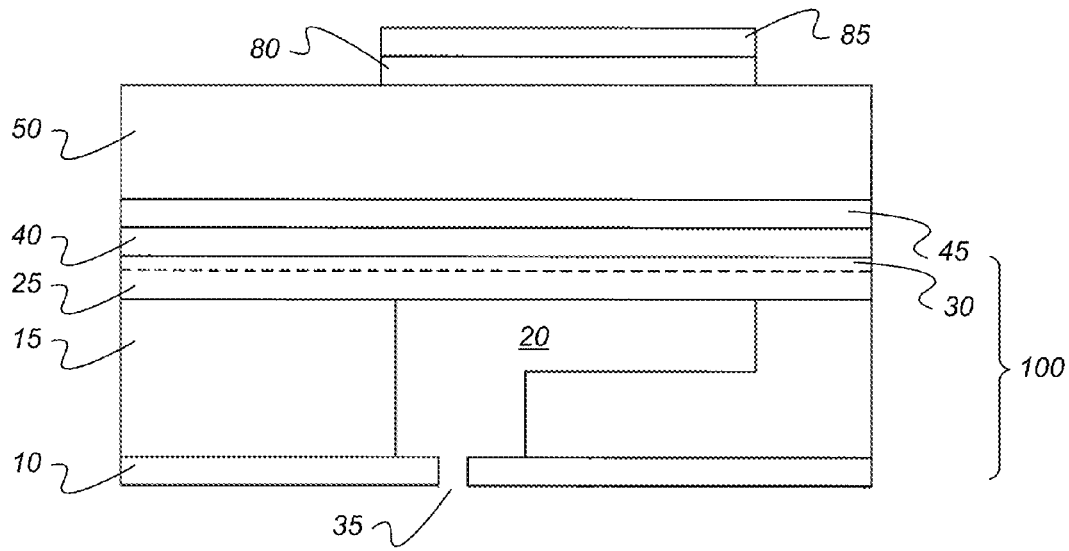
FIG._1
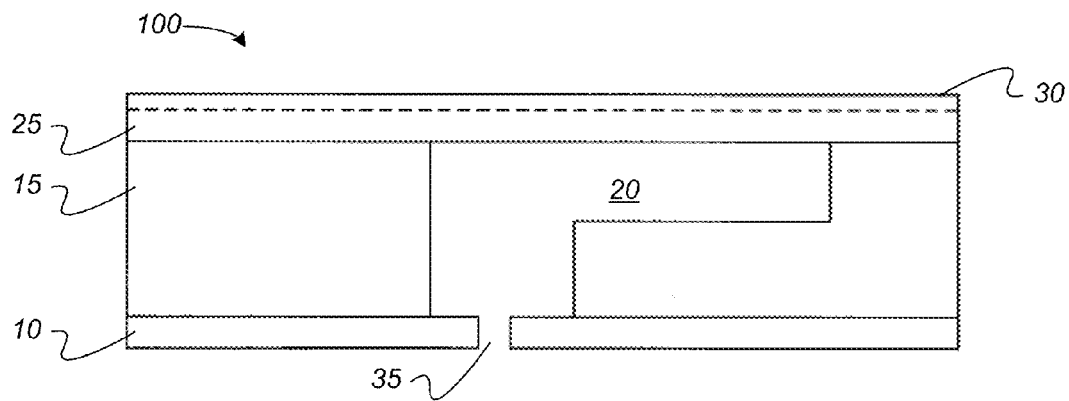
FIG._2

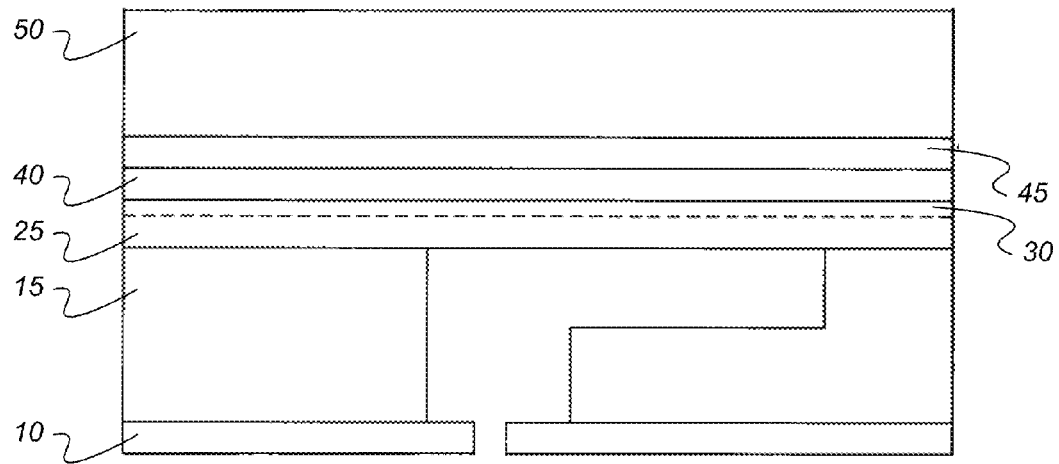
FIG._3
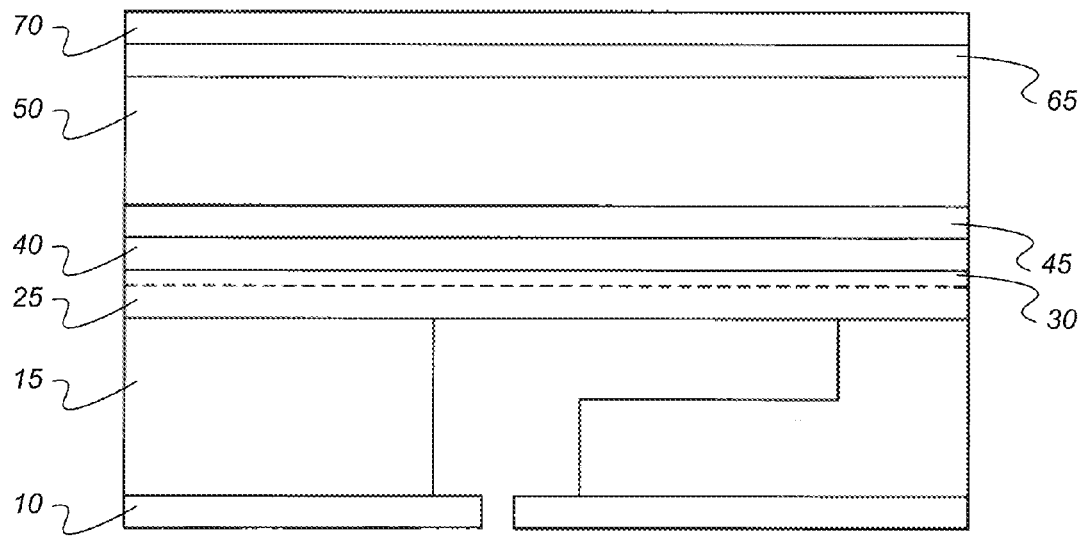
FIG._4

SPUTTERED PIEZOELECTRIC MATERIAL

BACKGROUND

This invention relates to forming piezoelectric material.

Piezoelectric materials can generate a voltage differential when subjected to mechanical stress. Alternatively, applying a voltage across a piezoelectric material can cause converse piezoelectricity, that is, the piezoelectric material mechanically deforms when a voltage is applied. Converse piezoelectricity can cause bending forces in the piezoelectric material that are extremely high. Both of these properties, generating electricity and converse piezoelectricity, are harnessed for use in electrical and mechanical devices, such as transducers, e.g., actuators and sensors. Multiple transducers, including a combination of actuators and sensors, can be combined together in a microelectromechanical system (MEMS).

Piezoelectric materials, such as lead zirconium titanate, can also be used to form ferroelectric RAM (FRAM). The piezoelectric material for either actuators or FRAMs can be obtained from a sol gel, ceramic green sheets, metal-organic chemical vapor deposition (MOCVD) formed layers or pre-fired blocks of piezoelectric material. However, each method can form piezoelectric materials of different quality and composition. For example, a sol gel formation technique may require many individual thin layers to form a thick piezoelectric material. Also sol gel formation can leave bonding agents in the final material. MOCVD typically forms thin layers of piezoelectric material and can have very low deposition rates.

SUMMARY

In one embodiment, a piezoelectric material includes a body of $Pb_{1.00+x}(Zr_{0.52}Ti_{0.48})_{1.00-y}O_3Nb_y$, where $x>-0.02$ and $y>0$.

In yet another embodiment, a ceramic target comprising a ceramic body has a composition of $Pb_{1.00+x}(Zr_{0.52}Ti_{0.48})_{1.00-y}O_3Nb_y$, where $-0.1 \leq x \leq 0.30$ and $0 < y \leq 0.2$.

A method of forming a piezoelectric material is described. A ceramic target is biased. The target is in a chamber. A support in the chamber is heated to above 450° C. A deposition surface is supported on the support. An inert and a reactive gas are introduced into the chamber to cause ceramic material from the ceramic target to be deposited onto the deposition surface to form the piezoelectric material.

Implementations of the devices described herein may include one or more of the following features. For the piezoelectric material, it is possible for $-0.01 \leq x \leq 0.15$ and $0 < y \leq 0.15$, such as for $0 \leq x \leq 0.05$ and $0.08 < y \leq 0.13$. The material can have a Perovskite crystalline structure. Y can be about 0.1. A piezoelectric stack and include the piezoelectric material with a first electrode on a first side of the material and a second electrode on a second side. The first electrode can include a conductive oxide directly adjacent to the piezoelectric material. The second electrode can include a seed layer adjacent to the piezoelectric material. The seed layer can include iridium. The seed layer can have a film surface with a (111) crystal orientation. The seed layer can include iridium oxide. The first electrode can include platinum. A MEMS can include a body having a compressible chamber formed therein and an actuator adjacent to the chamber, wherein the actuator includes the piezoelectric stack. For the ceramic target, y can be greater than or equal to 0.08. A seed layer can be applied to the deposition surface prior to depositing the ceramic material on the deposition surface. The seed layer can include a (111) crystal orientation. An adhesive layer can be applied on the deposition surface prior to applying the seed layer. After forming the piezoelectric material, an electrode can be applied on the piezoelectric material.

The details of one or more embodiments of the invention are set forth in the accompanying drawings and the description below. Other features, objects, and advantages of the invention will be apparent from the description and drawings, and from the claims.

DESCRIPTION OF DRAWINGS

FIG. 1 is a cross sectional view of a MEMS body with a transducer.

FIG. 2 is a cross sectional view of a MEMS body.

FIG. 3 is a cross sectional view of a MEMS body with an electrode and a piezoelectric layer.

FIG. 4 is a cross sectional view of a MEMS body with a transducer stack.

Like reference symbols in the various drawings indicate like elements.

DETAILED DESCRIPTION

Forming piezoelectric layers or structures of a device can be done in a number of different ways, as noted above. However, one method of piezoelectric material formation, PZT type formation in particular, is to sputter the material into its desired location. The sputtering process and the target used to form the piezoelectric material can in part determine the resulting characteristics of the piezoelectric layer, for example, the D31 coefficient (the magnitude of the transverse contracting or expanding of the layer perpendicular to the axis of polarization in response to a bias voltage applied across the layer) or the D33 coefficient (the magnitude of the thickness or longitudinal change along the polarization axis in response to a bias voltage applied across the layer). The characteristics of the material obtained by sputtering using a target that includes a specific amount of lead, zirconium, oxygen, titanium and dopant material, such as niobium, can be better than those achieved by other piezoelectric material formation methods. In addition, the plane of the surface on which the material is sputtered onto can also effect the quality of the piezoelectric material.

Referring to FIG. 1, a MEMS device having a piezoelectric transducer is shown. A body 100 has a main portion 15 with a chamber 20 therein. The chamber 20 is open to the environment through an aperture 35 in a bottom layer 10. Defining a part of the chamber 20 is a membrane 25 that covers the chamber 20 and the main portion 15 of the body 100. Optionally, the membrane 25 includes a layer 30 that is of a different material than the portion of the layer 30 that is directly adjacent to the chamber 20. In some embodiments, the body 100 is formed mostly of silicon, silicon dioxide or a combination thereof, for example, one or more layers of each material. For example, the main portion 15 can be formed of silicon while the bottom layer 10 can be formed of silicon or silicon oxide. The membrane 25 can be formed mostly of silicon while the layer 30 can be formed of silicon or silicon dioxide. The body 100 can be formed by adhering multiple layers together, such as with an epoxy or by fusion bonding the layers together.

A piezoelectric transducer 110 is formed on the body 100 over the chamber 20. The piezoelectric transducer 110 includes a lower electrode stack, an upper electrode stack, and a piezoelectric layer 50 located between the lower electrode stack and the upper electrode stack.

The lower electrode stack is disposed on the body 100. In some embodiments, the lower electrode stack includes two portions, an adhesion layer 40 adjacent the body 100 and a seed layer 45 on the adhesion layer 40. The two layers of the lower electrode stack are both electrically conductive layers. In some embodiments, the adhesion layer 40 is between about 50 and 1000 Angstroms (Å) thick, such as between about 100 and 500 Angstroms thick, although other thicknesses can be used. In some embodiments, the adhesion layer is formed of titanium, titanium tungsten, chromium, nickel, molybdenum or another suitable transition metal or conductive material. As its name implies, the adhesion layer 40 helps adhere the seed layer 45 to the membrane 25. Without the adhesion layer 40, with some types of seed layer materials, the seed layer 45 has a tendency to peel away from the membrane 25 or delaminate.

The seed layer 45 can be formed between 100 Å and 1 micron thick, such as between about 500 Å and 5000 Å thick. In some embodiments, the seed layer 45 is formed of platinum, iridium, or another suitable electrically conductive material. If the seed layer 45 is formed of iridium, the seed layer 45 can have a film surface with a (111) crystal orientation.

The upper electrode stack can include an adhesion layer 80 adjacent the piezoelectric layer 50 and a metal layer 85 on the adhesion layer 80. The adhesion layer 80 can be between about 100 Å and 1 micron thick, such as between about 100 Å and 1000 Å thick. In some embodiments, the adhesion layer 80 is formed of an electrically conductive material, such as titanium, titanium tungsten, chromium, nickel, nickel chromium or other suitable electrically conductive metal. In some embodiments, the adhesion layer 80 is formed of a metal oxide, such as indium tin oxide, zinc oxide, or other electrically conductive oxide. The metal layer 85 that is on the other side of the adhesion layer 80 from the piezoelectric layer 50 can be between 100 Å and 4 microns thick, such as between about 1000 Å and 2 microns thick. The metal layer can be formed of a conductive material, such as platinum, iridium, gold, copper, aluminum or other suitable transition metal.

The piezoelectric layer 50 is formed of a sputtered piezoelectric layer that is primarily lead zirconium niobium titanate. In some embodiments, the piezoelectric material is a Perovskite piezoelectric material. In some embodiments, the piezoelectric material has a greater percentage of (100) crystal orientation surface than (111) crystal orientation surface. In some embodiments, the piezoelectric material has a composition of $Pb_{1.00+x}(Zr_{0.5\pm0.02}Ti_{0.50\pm0.02})_{1.00-y}O_3Nb_y$, where $-0.01 \leq x \leq 0.15$ and $0 < y \leq 0.15$. In some embodiments $0 \leq x \leq 0.05$ and $0 < y \leq 0.10$. In some embodiments, $0.10 \leq y \leq 0.15$. In some embodiments, y is about 0.12. The piezoelectric layer 50 can have a thickness of at least 0.5 micron, such as about 1 micron or about 2 microns, or greater than about 4 microns, for example between about 4 and 6 microns or between about 6 and 8 microns thick.

The piezoelectric layer 50 of the stack can be activated by applying a voltage across the upper electrode stack and the lower electrode stack. Activation causes the combined membrane and piezoelectric layer to bend. An AC voltage can create a pumping action of the cavity 20. If there is fluid within the cavity 20, such as a liquid of sufficiently low viscosity, the pumping action forces the liquid out of the aperture 35 in the body 100.

Referring to FIGS. 2-4, a method of forming the transducer on the MEMS device is described. Referring to FIG. 2, the body 100 on which the transducer is to be formed is provided. An exemplary MEMS body is described in U.S. Publication No. 2005-0099467. However, other types of MEMS bodies can be provided on which a transducer is formed. Referring to FIG. 3, the lower electrode stack is formed by applying the adhesion layer 40 on to the body, such as by physical vapor deposition (PVD). The seed layer 45 is then applied, such as by PVD. If iridium is used to form the seed layer 45, the iridium can be formed with a film surface with a (111) crystal orientation.

The piezoelectric layer 50 is then applied. In some embodiments, a rotating RF magnetron PVD apparatus is used to form the piezoelectric layer 50. The PVD apparatus can have a tuned substrate RF impedance matching network for control of the substrate DC selfbias voltage. A suitable PVD apparatus is described in *Physical Vapor Deposition with Impedance Matching Network*, U.S. application Ser. No. 12/389,253, filed Feb. 19, 2009, which is incorporated herein by reference. The PVD apparatus can use a reactive PVD process with argon and oxygen gas for the sputtering gases. A ceramic PZT target that has a composition of $Pb_{1.00+x}(Zr_{0.52}Ti_{0.48})_{1.00-y}O_3Nb_y$, where $0 \leq x \leq 0.30$ and $0 \leq y \leq 0.2$, such as $0 \leq x \leq 0.05$ and $0 \leq y \leq 0.10$, can be used with the PVD apparatus. In some embodiments, the niobium content of the target is y=0.1, 0.11, 0.12 or 0.13. The amount of lead is kept below, for example, 1.30, to prevent forming excess grain boundaries in the resulting PZT. In some embodiments, the target consists of lead, titanium, zirconium and oxygen atoms and no other atomic species.

An exemplary process for forming PZT can have the following conditions. The wafer chuck temperature is between about 550° C. and 750° C., such as between about 650° C. and 720° C. Higher amounts of lead in the target can be compensated for with higher deposition temperatures. The $Ar/O_2$ pressure is between about 1 millitorr and 15 millitorr, such as between about 2 millitorr and 10 millitorr, for example, 2 millitorr and 6 millitorr. The gas ratio of $O_2/(Ar+O_2)$ is between about 0.5% and 4%, such as about 2.0%. The cathode RF power is between about 1000 W to 5000 W, such as between about 2000 W and 4000 W, for example about 3000 W. The substrate DC selfbias is between about +5V and +150V, such as between about +20V and +100V, for example, between about +40V and +80V. An hour of sputtering deposition at these conditions can create a piezoelectric layer that is a few microns, such as up to about 4 microns, thick.

To form the piezoelectric layer, a wafer that includes the desired deposition surface, such as a metallized body, for example, a layer of iridium with a film surface with a (111) crystal orientation is introduced into the PVD apparatus. An iridium film with a (111) crystal orientation can be deposited, such as with an argon sputtering deposition process. If the wafer has a layer of iridium as part of the lower electrode stack, the wafer can be brought to the deposition temperature, that is, to a temperature of greater than 450° C. and the deposition pressure. A gas having a small amount of oxygen, such as a 1% oxygen containing gas, can be flowed over the wafer. The low oxygen percentage oxygen gas is optionally flowed for at least 30 seconds, such as for a few minutes. The high temperature and oxygen gas causes the iridium surface to oxidize to form iridium oxide ($IrO_x$, $1 \leq x \leq 3$), which is conductive. The iridium oxide can improve the breakdown voltage of an actuator device. A conductive metal oxide can slow down oxygen loss from piezoelectric materials, because oxygen atoms are less likely to diffuse from the PZT into the metal electrodes. After the iridium layer is optionally oxidized, the sputtering process is begun to grow the piezoelectric material.

Referring to FIG. 4, the upper electrode stack, including adhesion layer 65 and metal layer 70, is applied onto the piezoelectric layer 50. The upper electrode stack and the lower electrode stack can be patterned, as desired. Optionally cuts can be made through the piezoelectric layer 50 to segment multiple actuators on the substrate.

The piezoelectric material that is described herein is a piezoelectric material that is has a high D31 coefficient. Because of the sputtering deposition, the piezoelectric material is very homogenous and can consist of atoms of lead, zirconium, oxygen, titanium and niobium with no binder or other residual material that other deposition processes leave behind. The piezoelectric layer that is formed, such as by using the seed layer described herein along with the process conditions for the PVD apparatus, can have a high percentage of Perovskite (100) crystal orientation. The niobium is a dopant that promotes a Perovskite structure. A sputtering target with the niobium quantities described above can result in PZT films that have a relative dielectric constant in the range of about 1000 to about 1600.

A number of embodiments of the invention have been described. Nevertheless, it will be understood that various modifications may be made without departing from the spirit and scope of the invention. For example, although PZT for actuators and FRAMs have been described, the material can be used for other structures. Accordingly, other embodiments are within the scope of the following claims.

What is claimed is:

1. A piezoelectric stack, comprising:
    a piezoelectric material comprising a body of $Pb_{1.00+x}(Zr_{0.52}Ti_{0.48})_{1-y}O_3Nb_y$, where $x>-0.02$ and $y>0$, and having a greater percentage of (100) crystal orientation surface than (111) crystal orientation surface;
    on a first side of the piezoelectric material, a first electrode; and
    on a second side of the piezoelectric material, a second electrode, the second electrode including a seed layer adjacent to the piezoelectric material and the seed layer having a film surface with a (111) crystal orientation.

2. The piezoelectric stack of claim 1, wherein the first electrode includes a conductive oxide directly adjacent to the piezoelectric material.

3. The piezoelectric stack of claim 1, wherein the seed layer includes iridium.

4. The piezoelectric stack of claim 1, wherein the seed layer includes iridium oxide.

5. The piezoelectric stack of claim 1, wherein the first electrode includes platinum.

6. A MEMS, comprising:
    a body having a compressible chamber formed therein; and
    an actuator adjacent to the chamber, wherein the actuator includes the piezoelectric stack of claim 1.

* * * * *